United States Patent
Walsh et al.

(10) Patent No.: US 7,855,685 B2
(45) Date of Patent: Dec. 21, 2010

(54) MICROWAVE COMMUNICATION PACKAGE

(75) Inventors: Matthew R. Walsh, Sharpsville, IN (US); Deepukumar M. Nair, Christiansburg, VA (US); David W. Zimmerman, Fishers, IN (US); Benjamen E. Haffke, Kokomo, IN (US); Scott D. Brandenburg, Kokomo, IN (US); Charles I. Delheimer, Noblesville, IN (US); Michael E. Miller, Rossville, IN (US); Bruce Wayne Butler, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 276 days.

(21) Appl. No.: 11/904,986

(22) Filed: Sep. 28, 2007

(65) Prior Publication Data

US 2009/0085808 A1    Apr. 2, 2009

(51) Int. Cl.
*H01Q 1/38*    (2006.01)
(52) U.S. Cl. ............................... 343/700 MS; 333/247; 333/248
(58) Field of Classification Search .......... 343/700 MS; 333/245, 246, 247, 248; 257/664, 700
See application file for complete search history.

(56) References Cited

U.S. PATENT DOCUMENTS

| | | | |
|---|---|---|---|
| 4,878,060 A * | 10/1989 | Barbier et al. .............. 343/778 |
| 5,023,624 A * | 6/1991 | Heckaman et al. ........... 343/860 |
| 6,172,412 B1 * | 1/2001 | Wein et al. ................... 257/664 |
| 6,809,688 B2 * | 10/2004 | Yamada ............... 343/700 MS |
| 6,967,543 B2 * | 11/2005 | Ammar ........................ 333/26 |
| 7,236,070 B2 * | 6/2007 | Ajioka et al. ............... 333/247 |
| 2005/0218505 A1 * | 10/2005 | Oman et al. ................. 257/702 |

OTHER PUBLICATIONS

Paul Dixon, Dampening Cavity Resonance Using Absorber Material, RF Design, May 16-18, 2004.*
Paul Dixon, Dampening Cavity Resonance Using Absorber Material, May 2004, RF Design, pp. 16-19.*

* cited by examiner

*Primary Examiner*—Michael C Wimer
*Assistant Examiner*—Kyana R Robinson
(74) *Attorney, Agent, or Firm*—Thomas N. Twomey

(57) ABSTRACT

A microwave communication package is constructed on an electrically conducting base plate having a first side defining a base plate cavity, with an antenna apparatus mounted on an opposite, second side. A dielectric substrate on the first side of the base plate covers the base plate cavity; and sealing apparatus contacting the dielectric substrate and the base plate completely around the base plate cavity hermetically seals the cavity. Circuitry mounted on a surface of the substrate within the base plate cavity includes one or more microstrip lines communicating components to one or more waveguides comprising openings extending through the base plate; and the waveguides are coupled at their opposite ends to the antenna apparatus.

18 Claims, 3 Drawing Sheets

MICROWAVE COMMUNICATION PACKAGE

TECHNICAL FIELD

The technical field of this invention is microwave communication packages.

BACKGROUND OF THE INVENTION

A microwave communication package may include an electronic circuit on a substrate and an antenna for microwave communication with external devices. Within the package, a microwave communication conduit is required between the electronic circuit and the antenna. In the prior art, the substrate and antenna have been mounted on opposite sides of a base plate, with the electronic circuit on the side of the substrate opposite the base plate. To provide a conduit for microwave communication within the package between the electronic circuit and the antenna, waveguides have been constructed through the substrate in line and coupled with waveguides through the base plate. This arrangement has the undesirable consequences of requiring construction of a waveguide through the solid dielectric material of the substrate and further requiring the microwave signal to propagate through the dielectric material of the substrate waveguide to a base plate waveguide of dissimilar physical size, resulting in mismatch losses.

SUMMARY OF THE INVENTION

This invention provides a microwave communication package constructed on an electrically conducting base plate having a base plate cavity in a first side with an antenna apparatus mounted on an opposing second side. A dielectric substrate is mounted on the first side of the base plate covering the base plate cavity, with sealing apparatus contacting the dielectric substrate and the base plate completely around the base plate cavity, whereby the base plate cavity is substantially hermetically sealed. Circuitry is mounted on a surface of the substrate within the base plate cavity. This circuitry includes components and one or more microstrip lines on the surface of the substrate for communication between the components and the antenna; and a ground plane member is disposed within the substrate parallel with the microstrip line. One or more waveguides extend through the base plate, and each waveguide has a first coupling directly to one of the microstrip lines and a second coupling to the antenna apparatus.

This invention eliminates the requirement for waveguides through the substrate material by creating a cavity in the base plate and placing the electronic circuitry within the cavity on the substrate surface facing the base plate; and there are thus no substrate waveguides to create mismatch losses. It further allows the circuitry to be hermetically sealed with the cavity for protection from moisture and allows easy overmolding of the substrate; and it also facilitates cooling of circuit components by placing them within the cavity, where they may be easily coupled to pedestals formed in the surface of the base plate for heat removal through the base plate.

BRIEF DESCRIPTION OF THE DRAWINGS

The present invention will now be described, by way of example, with reference to the accompanying drawings, in which.

DESCRIPTION OF EMBODIMENTS OF THE INVENTION

Figure 1:
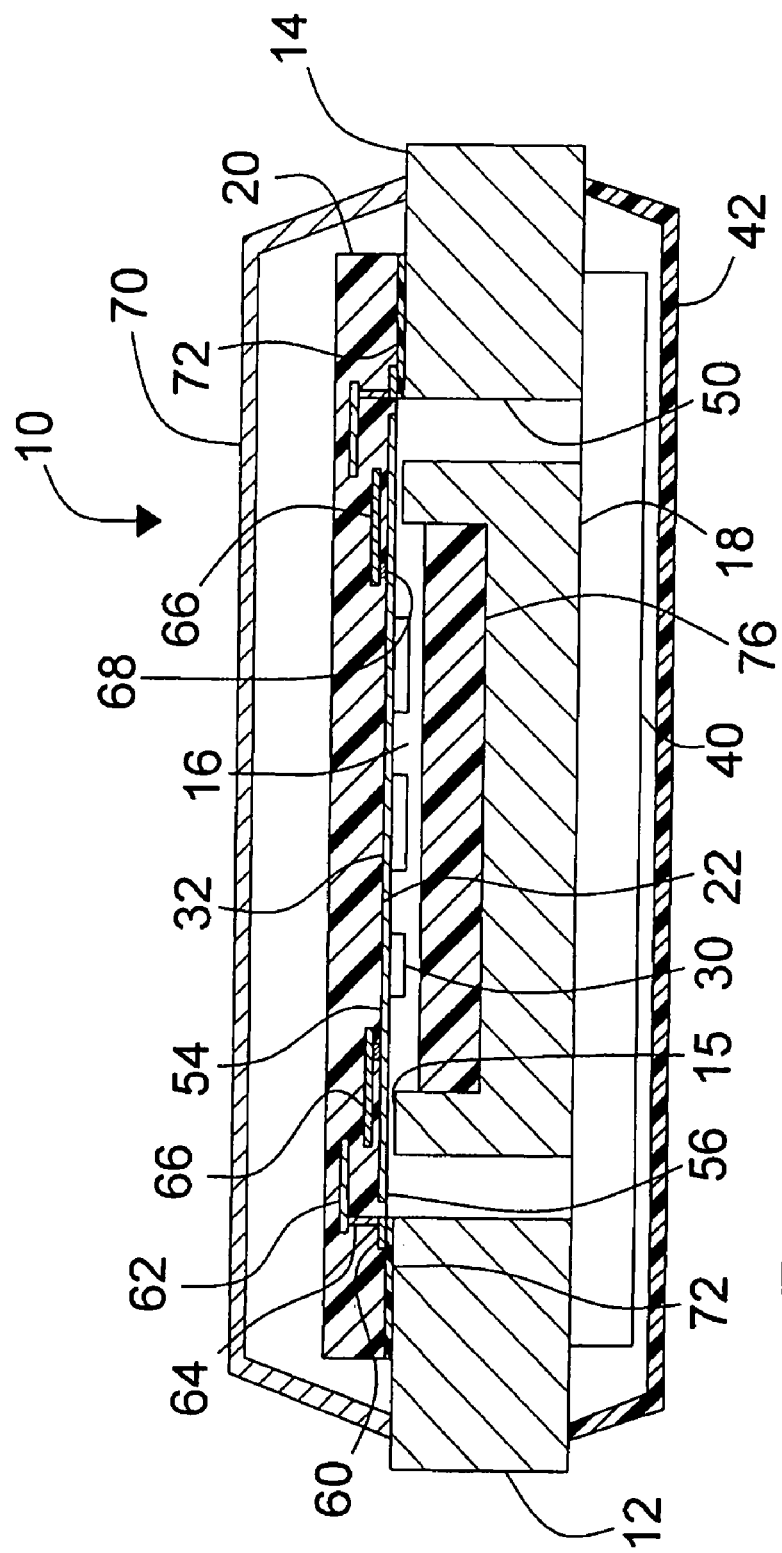
FIG. 1 is section view of a first embodiment of a microwave communication package according to the invention.
Figure 3:
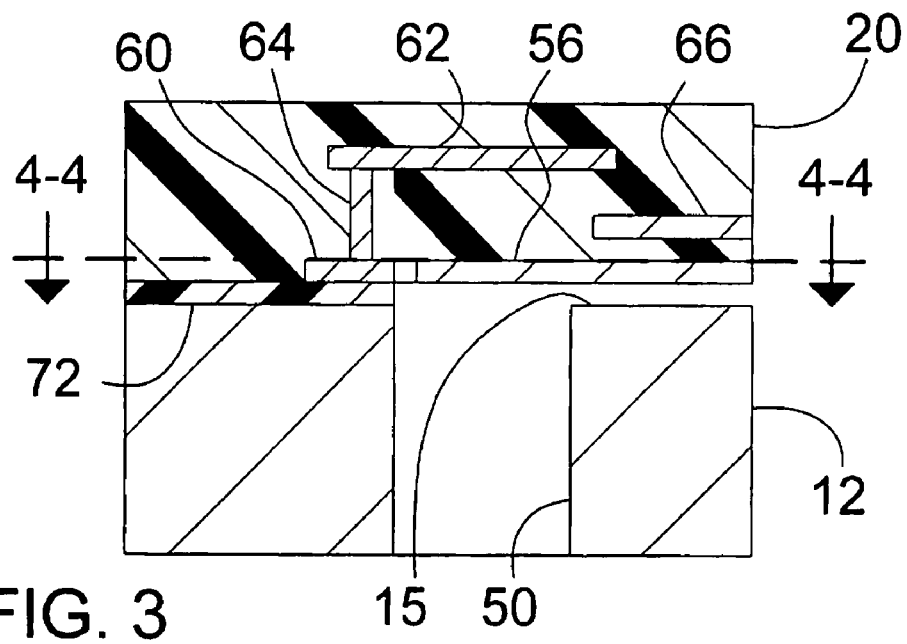
FIG. 3 is an enlarged view of a portion of the section view of FIG. 2.
Figure 4:
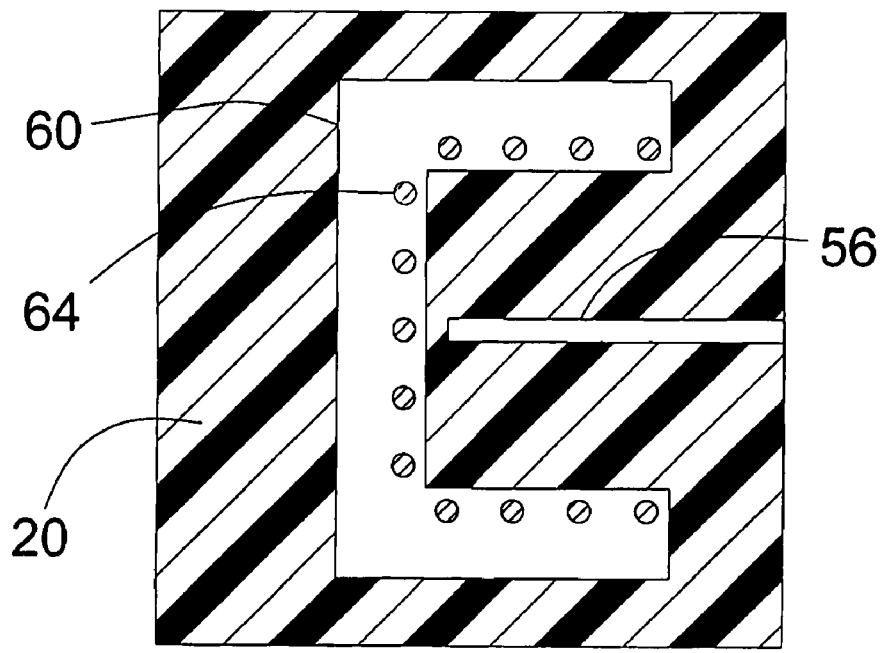
FIG. 4 is a section view through lines 4-4 of FIG. 3.

FIGS. 1, 3 and 4 show various views of a first embodiment of a microwave communication package 10 according to the invention. As an example, package 10 may comprise a radar transceiver operating at 76 GHz and suitable for mounting on a vehicle; but it is not restricted to radar and is usable in microwave equipment operating at frequencies in a range of at least 30 to 100 GHz essentially as shown and in a wider range with modifications that would be clear to those of ordinary skill in the art. It is not drawn to scale, since the range of dimensions, especially in the drawing vertical direction, is too great for accurately scaled representation of all parts simultaneously. Microwave communication package 10 includes a base plate 12 formed of an electrically conducting material such as, but not limited to, aluminum. Base plate 12 serves as a structural foundation for the package and has a first side 14 in which a cavity 16 is formed. A dielectric substrate 20 is attached to first side 14 of base plate 12, for example with an epoxy or similar adhesive, so that it covers and encloses cavity 16. Substrate 20 is preferably a multi-layer substrate known in the art in which horizontal conductors may be placed between layers and joined by perpendicular conductors. The dielectric substance of the substrate layers may be ceramic or organic, and conductors are preferably placed within or on substrate 20 in a printed or patterned metallization process. Electrical circuitry, comprising components 30 connected by circuit traces 32, is provided within cavity 16 on a first side 22 of substrate 20 facing base plate 12. This electrical circuitry may include microwave receiving and/or transmitting circuitry as well as signal processing circuitry.

A microwave antenna apparatus 40 is attached to a second side 18 of base plate 12 and may be enclosed by an electromagnetically transparent cover 42. Antenna apparatus may be of any suitable design and construction and is herein represented as a plain block with no particular details shown. Base plate 12, in addition to providing a mounting platform for antenna apparatus 40, provides electromagnetic shielding between antenna apparatus 40 and the circuitry 30, 32 in cavity 16.

Waveguides are provided as conduits for microwave communication between antenna apparatus 40 and electrical circuitry 30, 32. These waveguides may be any such waveguides known in the art and useful in a particular embodiment. In this embodiment, each waveguide comprises a cylindrical opening 50 through base plate 12 between first side 14 and second side 18. The word "cylindrical" applied to the opening defining a waveguide is used in the mathematical sense in which the cross section of the opening may be in the shape of any closed curve, for example: circle, rectangle, etc. In this embodiment, each waveguide is a WR-10 waveguide, in which the waveguide cross-section is rectangular; but other waveguide designs are known and may be used.

Appropriate microwave signal coupling apparatus is provided at each end of waveguide opening 50. This embodiment shows a coupling apparatus, known in the art, at first (upper in FIG. 1) side 14 of base plate 12, where base plate 12 abuts dielectric substrate 20. Circuit traces 32 include a microstrip line 54 on first side 22 of substrate 20 extending to waveguide opening 50 of base plate 12 and ending in a probe 56 extending across the axial end of waveguide opening 50. A ledge portion 15 of the upper surface 14 of base plate 12 at the outer periphery of cavity 16 provides access for microstrip line 54 and probe 56 into opening 50.

A shorting cap in substrate 20 directly above waveguide opening 50 in FIG. 1 electrically closes this end of the waveguide. The shorting cap, shown more clearly in the enlarged views of FIGS. 3 and 4, may comprise a conductor 62 between layers of substrate 20, spaced substantially one quarter wavelength from probe 56 at the desired transmission frequency, and a plurality of conductors 64 projecting downward from conductor 62 as shown. Conductors 64 may be spaced from each other; and they surround the circumference of opening 50, except for an opening to accommodate microstrip line 54, in order to provide a via fence reducing electrical energy loss from probe 56 into substrate 20. Conductors 62 are further coupled to an electrically conducting member 60 on first side 22 of substrate 20. Member 60 is further connected by conductors not shown to similar conductors 64, or to similar members 60, in the shorting caps of other waveguides to ensure a common ground for all such shorting caps. Member 60 may be formed in the metallization layer of circuit traces 30, although not connected thereto except for grounding purposes. In addition, a conductor 66 between two layers of substrate 20 extends parallel to microstrip line 54 and may be connected at one end to one or more of the conductors 64 of the shorting cap. It is noted at this point that package 10 of FIG. 1 shows identical waveguides on the left and right sides, although complete reference numbers are not provided on both sides due to space constraints. Conductor 66 is also connected through another conductor 68, in a direction perpendicular to conductor 66 and through one or more layers of substrate 20 as required, to a grounded portion of circuit traces 32. Conductor 66 forms a ground plane for microstrip line 54 and further grounds the shorting cap. As previously stated, the invention is not limited to the specific form of the waveguide and coupling apparatus shown herein, and many variations of such waveguide structure are known in the art.

A case member 70 may be placed over substrate 20 and fixed to first side 14 of base plate 12 to separate and protect substrate 20 from the external environment. Case member 70 may be made of any material selected as being useful in a particular application. In addition, sealing apparatus 72 is preferably placed between substrate 20 and base plate 12 to provide a substantially hermetic seal for cavity 16, so that moisture does not enter cavity 16 through the boundary between substrate 20 and base plate 12 and negatively affect circuitry 30, 32. In this embodiment, the sealing apparatus 72 takes the form of a sealant substance or member between first side 22 of substrate 20 and first side 14 of base plate 12 outside and peripherally surrounding circuitry 30, 32, waveguides 50 and cavity 16. The sealant substance of seal 72 may be, for example, silicone, epoxy, polymer, or a metal such as solder. In addition, a microwave absorbing substance 76 may be placed within cavity 16, for example attached to the first side 14 of base plate 20 as shown to reduce undesirable electromagnetic resonances within cavity 16.

Figure 2:
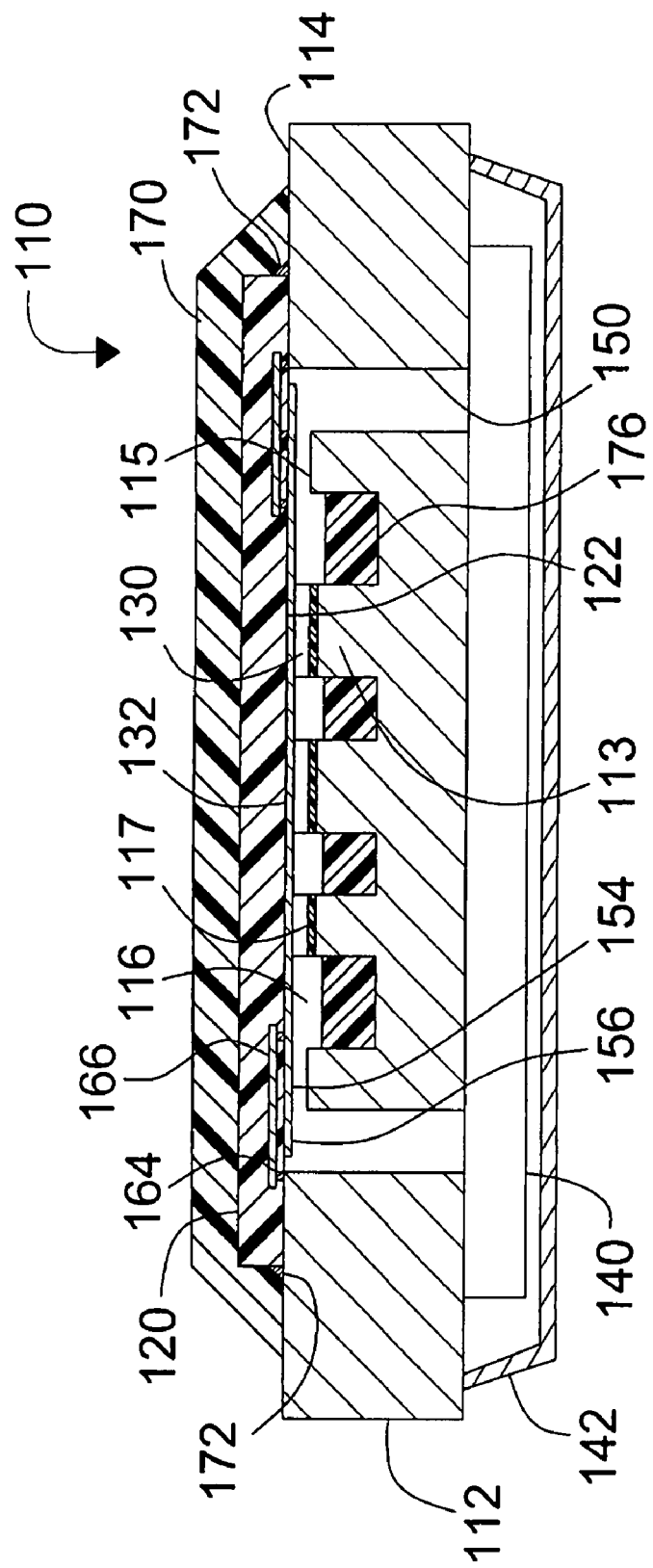
FIG. 2 is a section view of a second embodiment of a microwave communication package according to the invention.

FIG. 2 shows a microwave communication package 110 that introduces variations in a plurality of portions of the microwave communication package of FIG. 1. These variations are individually selectable in various combinations so that FIGS. 1 and 2 portray a plurality of embodiments significantly greater than two in number. In FIGS. 1 and 2, referenced elements of each figure providing similar structure and/or function are provided with similar reference numerals, with the reference number in FIG. 2 being 100 greater than the corresponding reference number of FIG. 1.

One way in which package 110 of FIG. 2 differs from that of FIG. 1 is that substrate 120 is enclosed with an overmolding compound 170, rather than being covered by a spaced cover. The capability of overmolding substrate 120 is one of the advantages of this invention; and it results from the mounting of substrate 120 with its first side 122 facing base plate 112 so that the circuitry components 130 and circuit traces 132 on first side 122 of substrate 120 are disposed within cavity 116 and thus separated from overmolding compound 170. Any suitable overmolding compound may be used, with thermoplastic or thermoset materials preferred.

Another way in which the apparatus of FIG. 2 differs from that of FIG. 1 is that a solder seal 172 is provided around substrate 120, rather than the sealant 72 shown in FIG. 1. Solder seal 172 provides structural attachment of substrate 120 to base plate 112 in addition to substantially hermetic sealing. Solder seal 172 is shown as a fillet but should be understood to extend inward a suitable distance between base plate 112 and substrate 120 surrounding cavity 116.

Yet another way in which the apparatus of FIG. 2 differs from that of FIG. 1 is that base plate 112 is provided with pedestals 113 within cavity 116 that contact or nearly contact selected components 130 mounted on substrate 120 for heat removal through base plate 112. A high heat-conducting substance 117 such as thermal grease may be placed as required between each of the selected components 130 and its associated pedestal 113 to eliminate any air gap and thus provide a solid thermal path therebetween for enhanced heat flow. Microwave absorbing substance 176, if used, can be placed around and between pedestals 113 within cavity 116.

A further way in which the apparatus of FIG. 2 differs from that of FIG. 1 is that it uses a waveguide-to-microstrip line coupling structure not requiring a shorting cap, as described in U.S. patent application Ser. No. 11/796,518, filed Apr. 27, 2007, titled Waveguide to Microstrip Line Coupling Apparatus and assigned to assignee of this application. The disclosure of the above-identified patent application is incorporated by reference into this application. This coupling structure uses a microstrip patch 156, tuned to the desired signal transmission frequencies, at the end of microstrip line 154, rather than the untuned probe 56 of apparatus 10 in FIG. 1. In addition, conductor 166, which provides a ground plane for microstrip line 154, is extended through substrate 120 as close as possible to side 122 thereof, to extend over the entire upper opening 150 of waveguide 150 in FIG. 2. A plurality of conductors 164 form a via fence projecting downward from conductor 166 around waveguide opening 150, consistent with providing a suitable access opening for microstrip line 154 connecting microstrip patch 156 with circuit traces 132. Since no quarter wavelength shorting cap is required, these conductors 164 may be significantly shorter in axial length than conductors 64 of FIG. 1. Microstrip patch 156 may be, for example, generally rectangular in shape and has a resonance spanning the desired microwave transmission bandwidth; but the specific shape and size of microstrip patch 156 shown or described herein are to be determined for a particular application and are not to be taken as limiting the scope of this invention.

The invention claimed is:
1. A microwave communication package, comprising:
an electrically conducting base plate having a first side and a second side opposite the first side;
a base plate cavity being defined in the first side of the base plate;

an antenna apparatus mounted on the second side of the base plate;

a dielectric substrate mounted to overlie and cover the base plate cavity defined in the first side of the base plate, said dielectric substrate having a first side being adjacent with the base plate cavity;

a sealing apparatus for sealing the first side of the dielectric substrate with the first side of the base plate remote from the base plate cavity, and the sealing apparatus completely surrounding the dielectric substrate such that the base plate cavity is substantially hermetically sealed;

electronic circuitry including one or more electronic components mounted on the first side of the dielectric substrate overlying the base plate cavity, the electronic circuitry further including one or more microstrip lines for microwave signal transmission disposed in the dielectric substrate and at least one ground plane member further disposed in the dielectric substrate; and one or more waveguides each comprising an opening extending through the base plate, and each waveguide being electrically coupled with the electronic circuitry and the antenna apparatus on the second side of the base plate.

2. The microwave communication package according to claim 1, wherein the sealing apparatus comprises an organically based substance.

3. The microwave communication package according to claim 1, wherein the sealing apparatus comprises solder.

4. The microwave communication package according to claim 1, further comprising a radiated microwave absorbing element affixed to the base plate within the base plate cavity.

5. The microwave communication package according to claim 1, wherein the dielectric substrate is covered and enclosed with an overmolding compound, said overmolding compound being further in connection with the first side of the base plate surrounding the dielectric substrate.

6. The microwave communication package according to claim 1, wherein the coupling of at least one of the waveguides to a microstrip line utilizes a coupling structure comprising a microstrip patch extending across a portion of the waveguide opening and a grounded via fence, said microstrip patch comprising being tuned to predetermined signal transmission frequencies, and said grounded via fence comprising a plurality of electrically conducting members being in parallel, spaced relationship to each other and perpendicular to the base plate, and being connected physically and electrically to the first side of the base plate and to an electrically conducting member remote from the base plate.

7. The microwave communication package according to claim 1, further including a ledge portion being defined in the first side of the base plate and extending from each opening of the one or more waveguides to the base plate cavity, and the ledge portion being spaced apart from the first side of the dielectric substrate to further define an access passage, said access passage providing access for the electronic circuitry to electrically communicate with the opening.

8. The microwave communication package according to claim 7, wherein the access passage has a first depth from the first side of the dielectric to the ledge and the base plate cavity has a second depth from the first side of the dielectric substrate to the base plate within the base plate cavity, said first depth is less than said second depth.

9. The microwave communication package according to claim 7, wherein the dielectric substrate and the sealing apparatus are configured to hermetically seal the base plate cavity and each opening of the one or more waveguides and the access passage.

10. The microwave communication package according to claim 7, wherein the opening is fluidly connected with the access passage, the access passage is fluidly connected with the base plate cavity, and a fluid in the opening and the access passage and the base plate cavity comprises an air fluid.

11. The microwave communication package according to claim 1, further including one or more pedestals defined in the base plate cavity, wherein the one or more pedestals extend from the base plate within the base plate cavity towards the first surface of the dielectric substrate, and at least one of the one or more pedestals is thermally coupled to the one or more electronic components disposed on the dielectric substrate for removing heat from the one or more electronic components through the base plate.

12. The microwave communication package according to claim 1, further including an electromagnetically transparent cover enclosing the antenna apparatus and connected to the second side of the base plate.

13. The microwave communication package according to claim 1, wherein the microwave communication package is operable across a range of frequencies between at least 30 to 300 Gigahertz.

14. The microwave communication package according to claim 1, wherein the antenna apparatus underlies the base plate cavity of the base plate and the openings of the at least one waveguides.

15. The microwave communication package according to claim 1, wherein the dielectric substrate is a multi-layered material and is configured to include electrical conductors for transmission of electrical signals between the one or more electronic components and at least one of, (i) the one or more micro strip lines, and (ii) the at least one ground plane member, and (iii) the one or more waveguides.

16. The microwave communication package according to claim 1, wherein the opening is disposed outbound from the base plate cavity on the base plate.

17. The microwave communication package according to claim 1, wherein the at least one ground plane is in parallel electrical connection with the one or more microstrip lines.

18. The microwave communication package according to claim 1, wherein the base plate comprises aluminum.

* * * * *